(12) United States Patent  (10) Patent No.: US 7,742,350 B2
Yamaguchi et al.  (45) Date of Patent: Jun. 22, 2010

(54) SEMICONDUCTOR DEVICE

(75) Inventors: Yoichi Yamaguchi, Kanagawa (JP); Masaru Shintani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 92 days.

(21) Appl. No.: 12/207,098

(22) Filed: Sep. 9, 2008

(65) Prior Publication Data

US 2009/0067271 A1    Mar. 12, 2009

(30) Foreign Application Priority Data

Sep. 10, 2007    (JP)  ............................... 2007-233526

(51) Int. Cl.
*G11C 7/00*    (2006.01)
(52) U.S. Cl. .................. 365/201; 365/230.05; 365/203; 365/233.1

(58) Field of Classification Search .................. 365/201, 365/230.05, 203, 233.1
See application file for complete search history.

(56) References Cited

U.S. PATENT DOCUMENTS 7,505,339 B2 * 3/2009 Ohbayashi ................... 365/201

FOREIGN PATENT DOCUMENTS

JP    2006134379 A    5/2006

* cited by examiner

*Primary Examiner*—David Lam
(74) *Attorney, Agent, or Firm*—Sughrue Mion, PLLC

(57) ABSTRACT

A word line WLA of A port is activated based on a clock signal ACLK, and a word line WLB of B port is activated based on a port setting signal RDXA indicating that A port is a selected state. In addition thereto, a bit line of B port is precharged. A state in a simultaneous access operation is reproduced by activating the word line WLB during a time period of activating the word line WLA regardless of a delay difference of the clock signal and maintaining Vds of an access transistor of A port at a constant value.

7 Claims, 7 Drawing Sheets

SEMICONDUCTOR DEVICE

BACKGROUND OF THE INVENTION

1. Field of the Invention

The present invention relates to a semiconductor device with a multiport RAM macro accessible from plural ports, particularly relates to a semiconductor device including a test circuit for setting a test condition for the RAM macro.

2. Description of Related Art

A multiport RAM macro accessible from plural ports can be accessed to a memory cell independently and asynchronously from respective ports. There is also a case in which while carrying out an operation of reading data from a certain port for the memory cell, an access is made from other port to the same memory cell. Hereinafter, this is referred to as a simultaneous access operation from the plural ports to the same memory cell.

An explanation will be given of the simultaneous access operation to the same memory cell in a dual port RAM. FIG. 7 is a memory cell circuit diagram of a dual port RAM. A memory cell M1 of a dual port RAM is constituted by two driver transistors of MN1 and MN2, and load driver transistors of MP1 and MP2. Further, transistor MN3, MN4, MN5 and MN6 are access transistors for switching accesses from the respective ports to the memory cell M1.

An explanation will be given of the simultaneous access operation to the same memory cell from A port and B port when the memory cell M1 holds "0" data (NODE1 is at "L" level, NODE2 is at "H" level) in such a dual port RAM.

In a read operation from A port, a word line WLA becomes an active level and the access transistors MN3 and MN4 are turned ON. When NODE2 is at "H" level, the driver transistor MN2 is turned ON, and a charge of a bit line DTA precharged to a power supply voltage is drawn along a broken line. At this occasion, when the memory cell M1 is accessed through B port, a word line WLB of B port becomes an active level, and the access transistors MN5 and MN6 of B port are turned ON. Although a charge of a precharged bit line DTB is drawn similar to the charge of the bit line DTA, by being MN3 and MN5 turned ON simultaneously, in comparison with the case of being either one of MN3 and MN5 turned ON, a potential level of NODE1 is elevated. By elevating the potential level of NODE1, drain-source voltages Vds of the access transistors MN3 and MN5 are lowered, as a result, a speed of drawing the charge of the bit line DTA is retarded. Therefore, a sufficient read time period cannot be ensured within a set cycle and data reading becomes uncertain.

On the other hand, JP-A-2006-134379 describes a method of firmly carrying out data-read operation even in the above-described case of selecting the same row address at the same cycle. FIG. 9 shows a dual port RAM described in JP-A-2006-134379. According to the dual port RAM, when the same row address is selected by accesses from plural ports, a control signal RP outputted by a read control circuit 116a of one port for memory access is transmitted also to a write control circuit 106a of other port, and a delay is produced in controlling other port such that an access transistor for the port is not activated simultaneously. JP-A-2006-134379 describes a method of controlling timings of outputting activating signals of ports different from each other in this way.

However, a write operation is retarded until data is read firmly in a read operation by controlling timings of outputting the activating signals of the different ports, and therefore a cycle time is deteriorated.

When the above-described control of timings of outputting the activating signals is not carried out in order to avoid deterioration in the cycle time, it is made necessary to set the power supply voltage to be high in order to normally operate the RAM macro even in the simultaneous access operation from the plural ports to the same memory cells.

The power supply voltage necessary when the simultaneous access operation is carried out is provided with a characteristic as shown by FIG. 8 for an access delay difference between ports. In FIG. 8, the abscissa designates an access delay difference between the ports, the ordinate designates a power supply voltage necessary for a normal operation. Here, a delay value 0 indicates that a time period of making an access from A port and a time period of making an access from B port are quite the same, a left side of the delay value 0 indicates a case in which an access of B port precedes an access of A port, and a right side of the delay value 0 indicates a case in which an access of B port is delayed from the access of A port. As shown by FIG. 8, it is known that the highest power supply voltage is needed when the time periods of making accesses from A port and B port are the same.

Therefore, in order to guarantee such a power supply voltage, a situation in which time periods of making accesses from plural ports are quite the same needs to be reproduced in testing the multiport RAM macro. However, clock signals supplied to the respective ports are provided with a delay difference among the signals and it is difficult to operate the clock signals supplied to the respective ports completely simultaneously. Further, word lines of the respective ports are activated in accordance with such clock signals, and therefore, time periods of bringing word lines of the plural ports at active levels cannot be made to coincide with each other. Further, it is also difficult to set such that the time periods of bringing the word lines of the plural ports at the active levels are overlapped the most.

A power source standard in testing can also be corrected based on the characteristic of the power supply voltage as shown by FIG. 8. For example, as shown by FIG. 8, assuming that a difference of a delay between respective ports is a, by setting the power supply voltage to be high by b, a power supply voltage standard under the worst condition can be set. When a skew between ports is c', a voltage to be corrected inherently is to be small since measurement is carried out at a vicinity of the worst condition. However, an actual delay amount is unknown in testing, and therefore, when a power supply voltage standard higher by an amount b', is set by assuming the delay amount as a delay amount a', an excessive power supply volgate is guaranteed.

SUMMARY

In one embodiment, a semiconductor integrated circuit according to the invention includes a RAM macro including a memory block having plural memory cells accessible from plural ports, a first word line control circuit for activating a word line of a first port in the plural ports in accordance with a first word line control signal, a first precharge control circuit for carrying out a precharge control of a bit line of the first port, a second word line control circuit for activating a word line of a second port in the plural ports in accordance with a second word line control signal, and a second precharge control circuit for carrying out a precharge control of a bit line of the second port, and a test circuit including a test setting circuit for generating a first and a second port setting signal for setting a selected state or a nonselected state respectively for the first and the second ports in accordance with a test mode signal, setting the selected state for either one of the first and the second ports and setting the nonselected state for other thereof, a first selecting circuit for supplying a clock signal supplied from outside to the first word line control circuit as the first word line control signal when the first port is set to the selected state based on the first port setting signal and supplying a first test control signal to the first word line control circuit as the first word line control signal when the first port is set to the nonselected state, and a second selecting circuit for supplying the clock signal to the second word line control circuit as the second word line control signal when the second port is set to the selected state based on the second port setting signal and supplying a second test control signal to the second word line control circuit as the second word line control signal when the second port is set to the nonselected state, wherein the first and the second precharge control circuits precharge the bit line of the port set to the nonselected state when the first and the second ports are respectively set to the nonselected state respectively based on the first and the second port setting signals.

According to the invention, the clock signal is supplied to the port set to the selected state by the port setting signal similar to a normal operation, and the port set to the selected state activates the word line based on the clock signal. On the other hand, the word line is activated based on the test control signal for the port set to the nonselected state. Therefore, the word line of the port set to the nonselected state can be activated during a time period in which the word line of the port set to the selected state is activated without taking a delay amount of the clock signal between the ports into consideration. Further, by precharging the bit line of the port set to the nonselected state, a drain-source voltage of an access transistor when the word line of the port set to the selected state is activated is minimized. In this way, there is reproduced a condition in which the highest power supply voltage is needed for an operation of reading data by the port set to the selected state.

According to the semiconductor integrating circuit of the invention, the condition of needing the highest power supply voltage for operation of the multiport RAM macro can be reproduced and the multiport RAM macro can be tested by a pertinent power source standard.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Although here, an explanation will be given such that an RAM macro 2 is a dual port RAM macro accessible from A port and B port, the same goes with a case of a multiport RAM macro including three or more of ports. Further, numbers of word lines and bit lines in a memory cell array are not limited to numbers shown in following embodiments.

Figure 1:
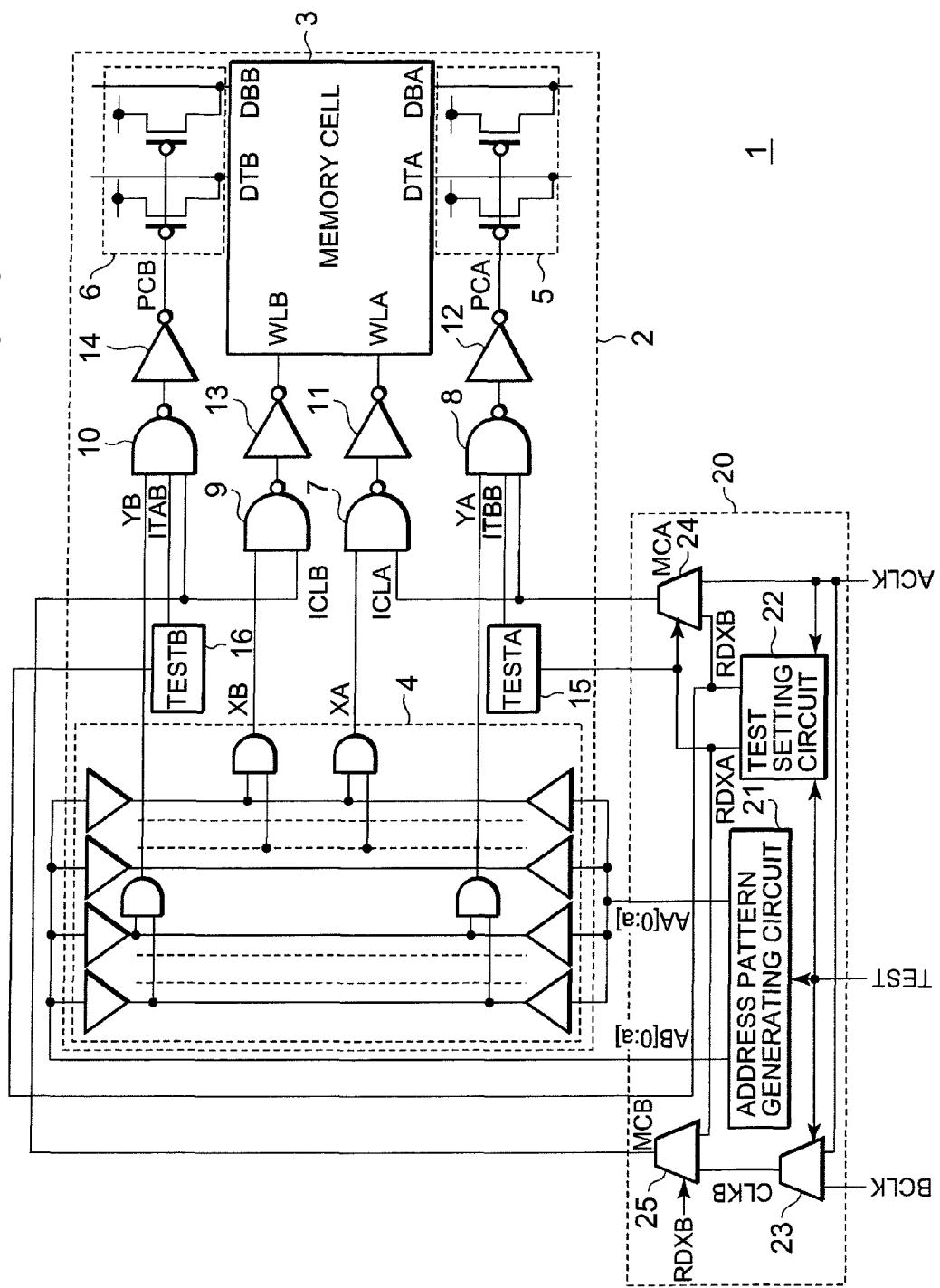
FIG. 1 is a block diagram of a semiconductor device according to a first embodiment of the invention.

FIG. 1 is a diagram showing a semiconductor device 1 with the RAM macro 2 and a test circuit 20 according to a first embodiment of the invention. According to the first embodiment of the invention, the test circuit 20 is the BIST (Built-in Self Test) circuit for testing the RAM macro 2.

The BIST circuit 20 includes an address pattern generating circuit 21, test setting circuits 22 for a simultaneous access operation and selectors MCA 24 and MCB 25.

The address pattern generating circuit 21 generates an address signal for testing respective ports and generates an address signal for testing such that the same memory cell is accessed through all of the ports in testing a simultaneous access operation.

The test setting circuit 22 generates port setting signals RDXA and RDXB for selecting ports from which data is to be read, and sets "H" level indicating that only either one of the port setting signals RDXA/RDXB is selected in testing the simultaneous access operation. A selector 23 supplies a user clock signal BCLK for B port supplied from outside in a normal operation to B port and supplies a user clock signal ACLK for A port supplied from outside in testing a simultaneous access operation as clock signals.

The selector MCA 24 selects a clock signal ACLK when the port setting signal RDXA is at "H" level, that is, when A port is designated as a port from which data is to be read, and selects the port setting signal RDXB when the port setting signal RDXA is at "L" level, that is, when B port is designated as a port from which data is to be read. The selector MCA 24 outputs the selected signal based on the port setting signal RDXA as internal clock signal ICLA. Similarly, the selector MCB 25 selects a clock signal BCLK when the port setting signal RDXB is at "H" level, that is, when B port is designated as a port from which data is to be read and selects the port setting signal RDXA when the port setting signal RDXB is at "L" level, that is, when A port is designated as a port from which data is to be read. The selector MCA 25 outputs the selected signal based on the port setting signal RDXB as the internal clock signals ICLB.

Further, although not illustrated, the address pattern generating circuit 21 outputs an address signal for testing in accordance with the user clock signal ACLK selected by the selector 23 in testing and also the simultaneous access operation test setting circuit 22 outputs the port setting signals RDXA and RDXB for testing in synchronism with the user clock signal ACLK.

The RAM macro 2 includes an address decoder 4 for decoding address signals supplied for respective ports, precharge circuits 5 and 6 for precharging bit lines of the respective ports connected to the memory cells, and NAND circuits 7 through 10, inverter circuits 11 through 14, and prepcharge control signal generating circuits 15 and 16.

The NAND circuit 7 and the inverter circuit 11 as well as the NAND circuit 9 and the inverter circuit 13 respectively generate word line activating signals for activating word lines WLA/WLB of the respective ports based on row address signals XA/XB in synchronism with internal clock signals ICLA/ICLB. That is, the word line of selected port from which data is to be read is activated in response to the clock signal, and the word line of nonselected port is activated in response to the port setting signal for selected port. Thus, the word line of the nonselected port is activated while another port is selected, and the simultaneous access operation to the same memory cell can be reproduced. Further, the nonselected port is activated in synchronism with the clock signal, and therefore, it is not necessary to take into consideration of an access delay difference (skew) by the clock signals among the respective ports.

The precharge control signal generating circuits TESTA 15 and TESTB 16 serve as buffers respectively outputting the port setting signals RDXA and RDXB as precharge control signals ITAB/ITBB. The NAND circuit 8 and the inverter circuit 12 as well as the NAND circuit 10 and the inverter circuit 14 respectively generate precharge activating signals PCA/PCB in response to column address signals YA/YB, internal clock signals ICLA/ICLB and the precharge control signals ITAB/ITBB.

Next, an explanation will be given of operation of the RAM macro 2 and the test circuit 20 according to the first embodiment of the invention in reference to FIG. 2. A time period T51 designates a case in which with regard to a read operation of A port, and a time period T52 designates a case in which with regard to a read operation of B port.

When a test mode signal TEST (not illustrated) for instructing a simultaneous test operation test is inputted, the address generating circuit 21 generates address signals AA [0:a] and AB [0:a] by which A/B ports respectively select the same memory cell. The decoder circuit 4 generates row address signals XA/XB and column address signals YA/YB by decoding the address signals. Further, the port selecting circuit 22 generates the port setting signals RDXA and RDXB one of which is at "H" level. In the time period T51, the port setting signal RDXA instructing the read operation of A port is at "H" level. By receiving the port setting signal RDXA which is at "H" level, the selector 23 outputs the user clock signal ACLK as the clock signal CLKB and the selector MCA 24 outputs the user clock signal ACLK as the internal clock signal ICLA. The word line WLA of A port becomes "H" level from "L" level in response to the internal clock signal ICLA. Further, the precharge activating signal PCA is changed to "H" level in response to the column address signal YA which is at "H" level, the internal clock signal ICLA and the precharge control signal ITBB. As a result, at the bit line DTA/DBA of A port, data read from the memory cell is propagated as a small signal.

On the other hand, the internal clock signal ICLB is changed to "H" level by receiving the port setting signal RDXA at "H" level. Further, the word line WLB of B port is changed to "H" level from "L" level by receiving the internal clock signal ICLB at "H" level. Further, the precharge control signal ITAB becomes "L" level by receiving the port setting signal RDXB at "L" level and the precharge activating signal PCB becomes "H" level. As a result, the bit lines DTB/DBB of B port are maintained in a state of being precharged to the power supply voltage.

In this way, whereas the word line WLA of A port is activated in accordance with the clock signal, the word line WLB of B port is activated in accordance with the port setting signal which is not the clock signal, and therefore, it is not necessary to take the access delay difference (skew) by the clock signal between ports into consideration. Therefore, in the time period of activating the word line WLA of A port which is selected, the word line WLB of B port which is not selected can be activated, and a state in which with regard to read operation of A port, the access is made simultaneously from B port can be reproduced.

Figure 2:
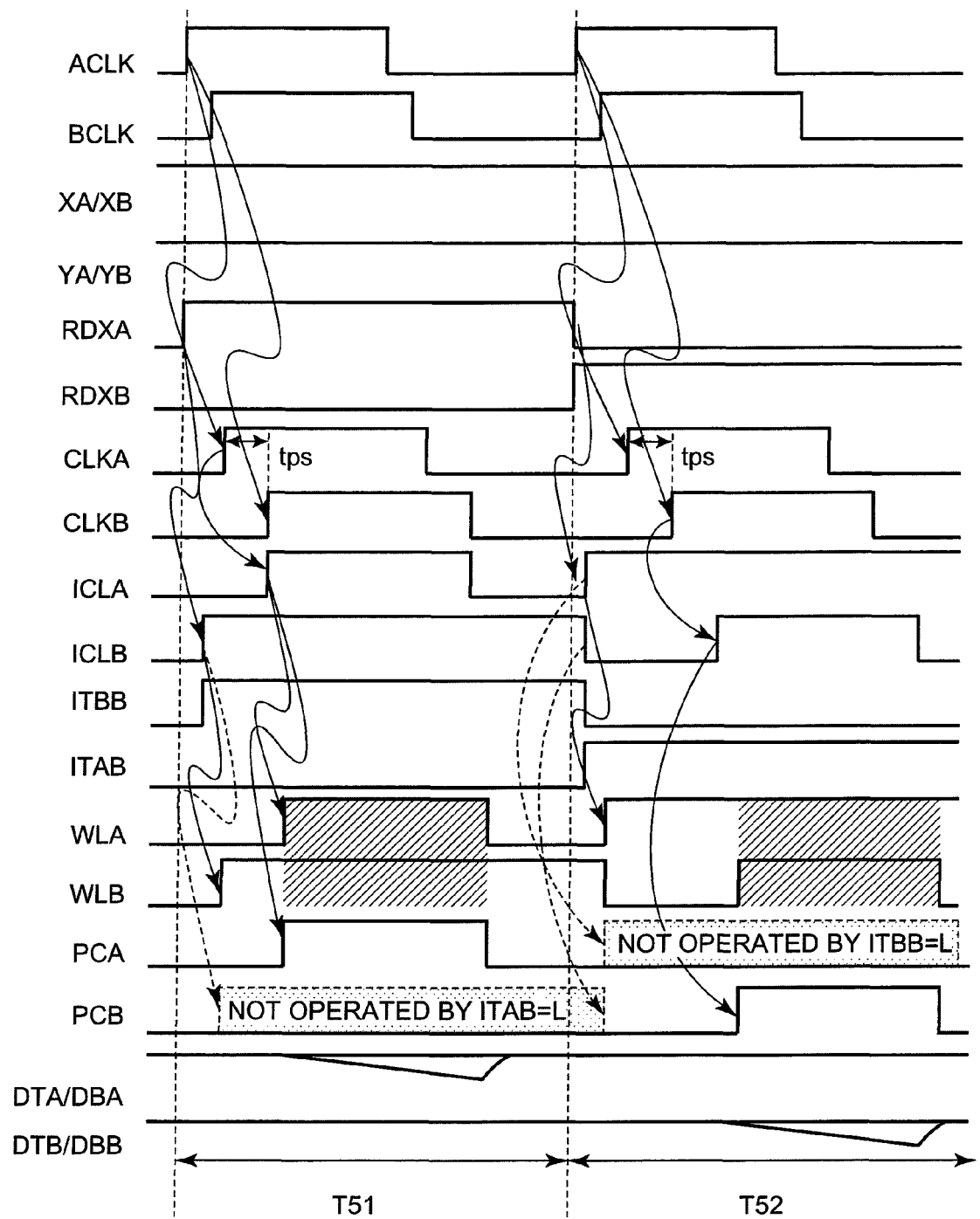
FIG. 2 is a waveform diagram illustrating an operation of the semiconductor device shown in FIG. 1.
Figure 3:
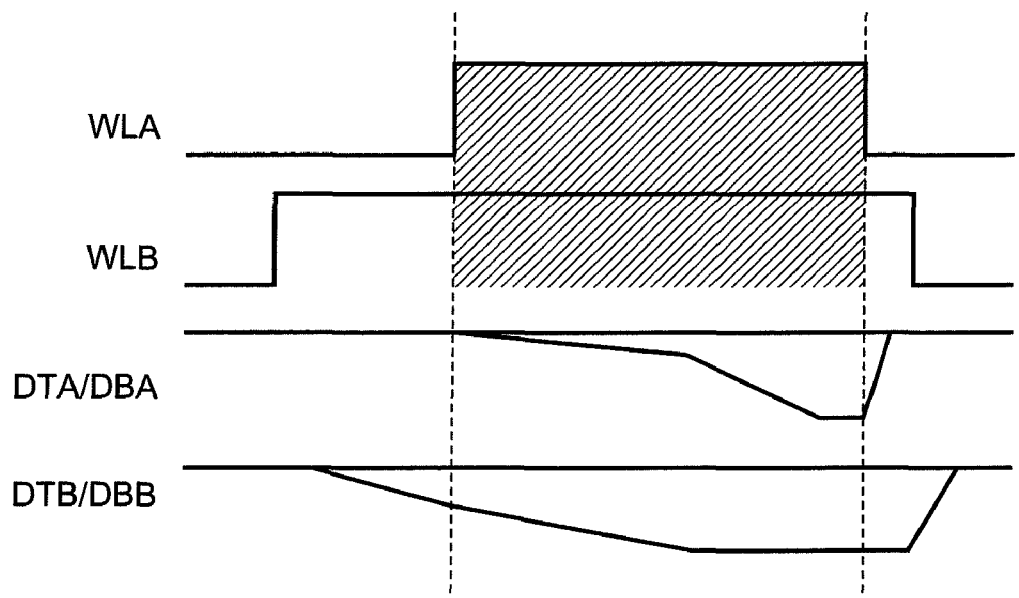
FIG. 3 is a waveform diagram illustrating an operation when a bit line of a nonselected port is not precharged in a simultaneous access operation of a dual RAM macro.
Figure 4:
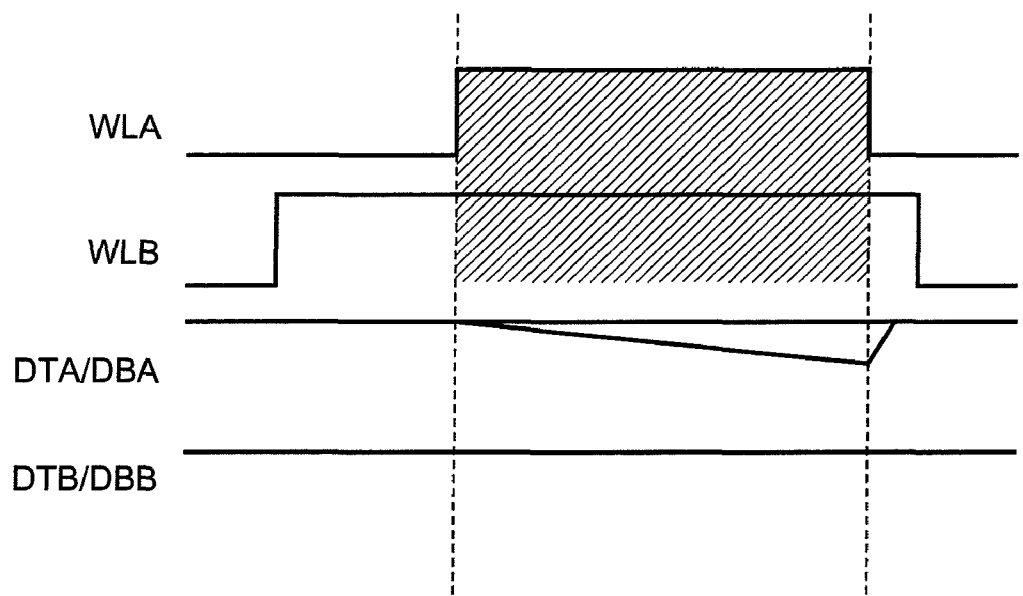
FIG. 4 is a waveform diagram illustrating an operation when the bit line of the nonselected port is precharged in the simultaneous access operation of the dual port RAM macro.
Figure 7:
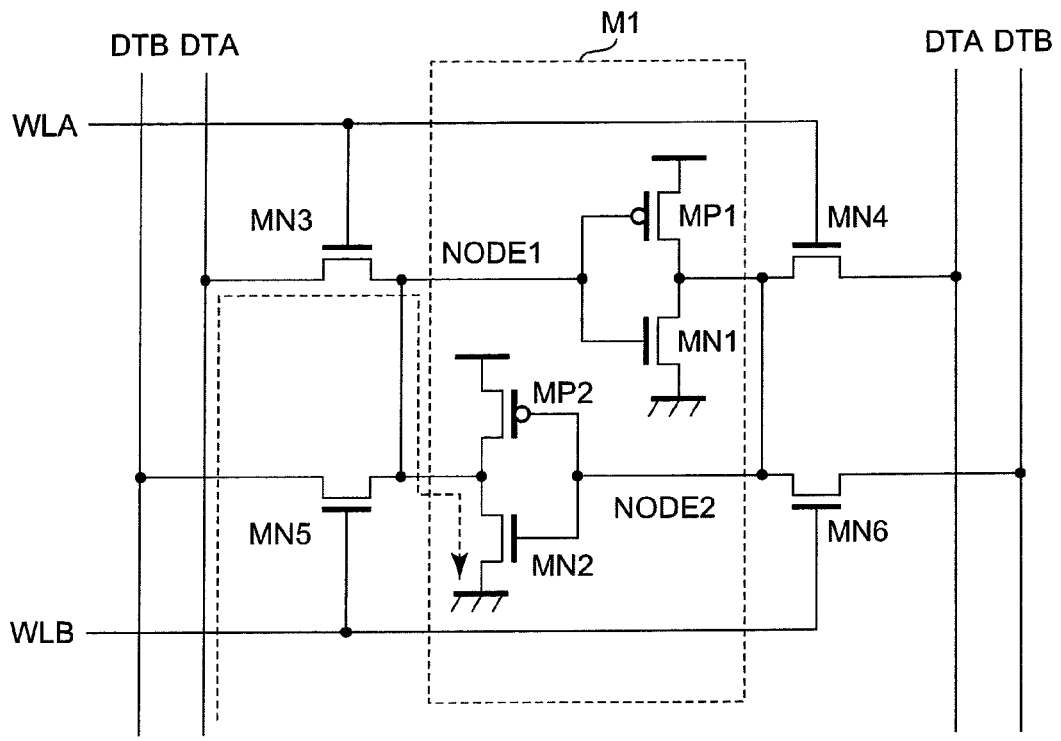
FIG. 7 is a memory cell circuit diagram of a dual port RAM.
Figure 8:
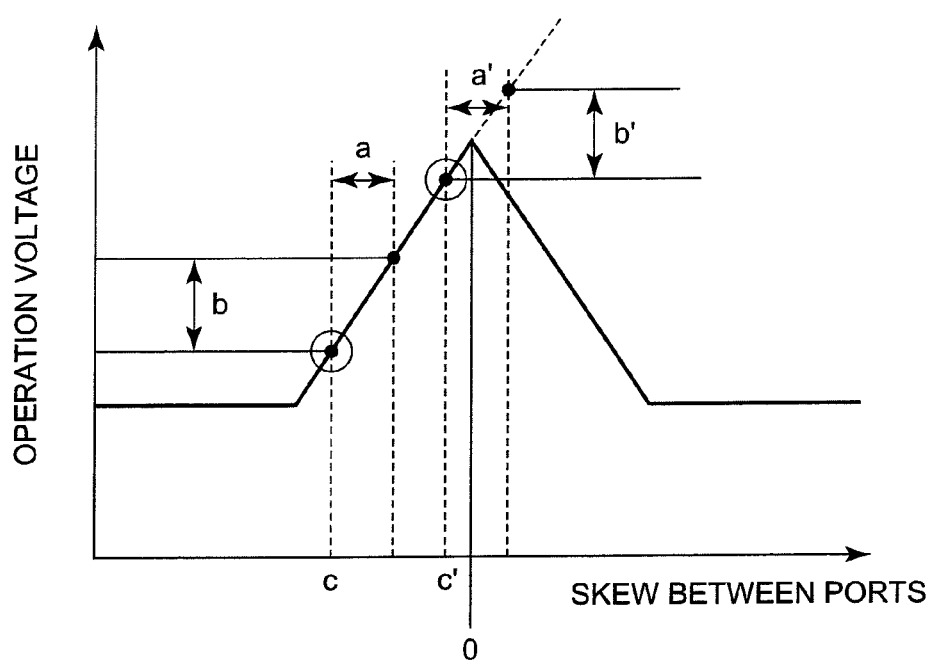
FIG. 8 is an image diagram of a power supply voltage for an access delay difference among ports in a simultaneous access operation of the dual port RAM.
Figure 9:
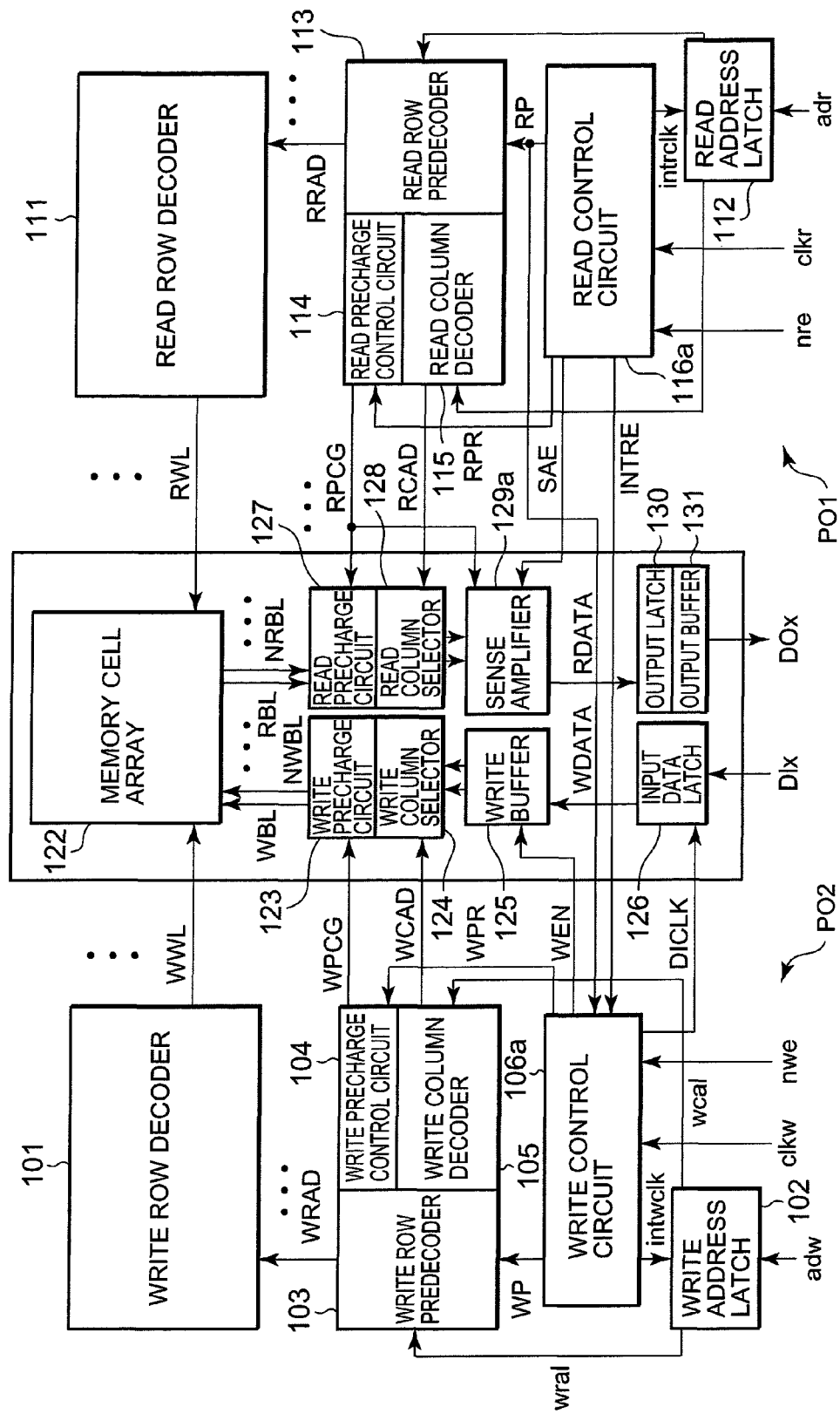
FIG. 9 is a block diagram of a dual port RAM of a related art.

Meanwhile, according to FIG. 2, the word line of B port is activated prior to the word line of A port, and access time periods of A and B ports are not completely the same. However, according to the invention, the worst condition is reproduced by maintaining the bit line in the precharged state while activating the word line. That is, as shown by FIG. 3, when the selected port is constituted by A port and the nonselected port is constituted by B port, and the word line WLB of the nonselected port is activated prior to the word line WLA of the selected port, before drawing the charge of the bit line DTA of the selected port, the charge of the bit line DTB of the nonselected port is drawn and the potential is lowered. When the potential of the bit line DTB is lowered, a level of an inner contact NODE1 is lowered (refer to FIG. 7 with regard to the constitution of the memory cell). Thereafter, even when the word line WLA of A port is activated, the drain-source voltage Vds of the access transistor MN3 is maintained in a large state, a charge drawing speed of the bit line of DTA is accelerated. However, when the access time periods of A port and B port are completely the same, there is brought about a state in which as described above, Vds of the access transistor MN3 of A port is lowered and data reading from the bit line DTA is retarded. Hence, as shown by FIG. 4, the bit line of B port is set to the precharged state such that Vds of the access transistor MN3 of A port maintains a constant value. In this way, the worst condition by the simultaneous access operation is made to be able to be reproduced even when the word line of the nonselected port is activated prior to the word line of the selected port by precharging the bit line of B port which is not selected.

Further, in FIG. 2, a time period T52 designates an operation when the selected port is constituted by B port. The operation is constituted by an operation of switching signals respectively in correspondence with A port and B port, and therefore, a detailed explanation thereof will be omitted.

Next, an explanation will be given of a semiconductor device 1A with an RAM macro 2a and its test circuit according to a second embodiment of the invention in reference to FIG. 5 and FIG. 6.

Figure 5:
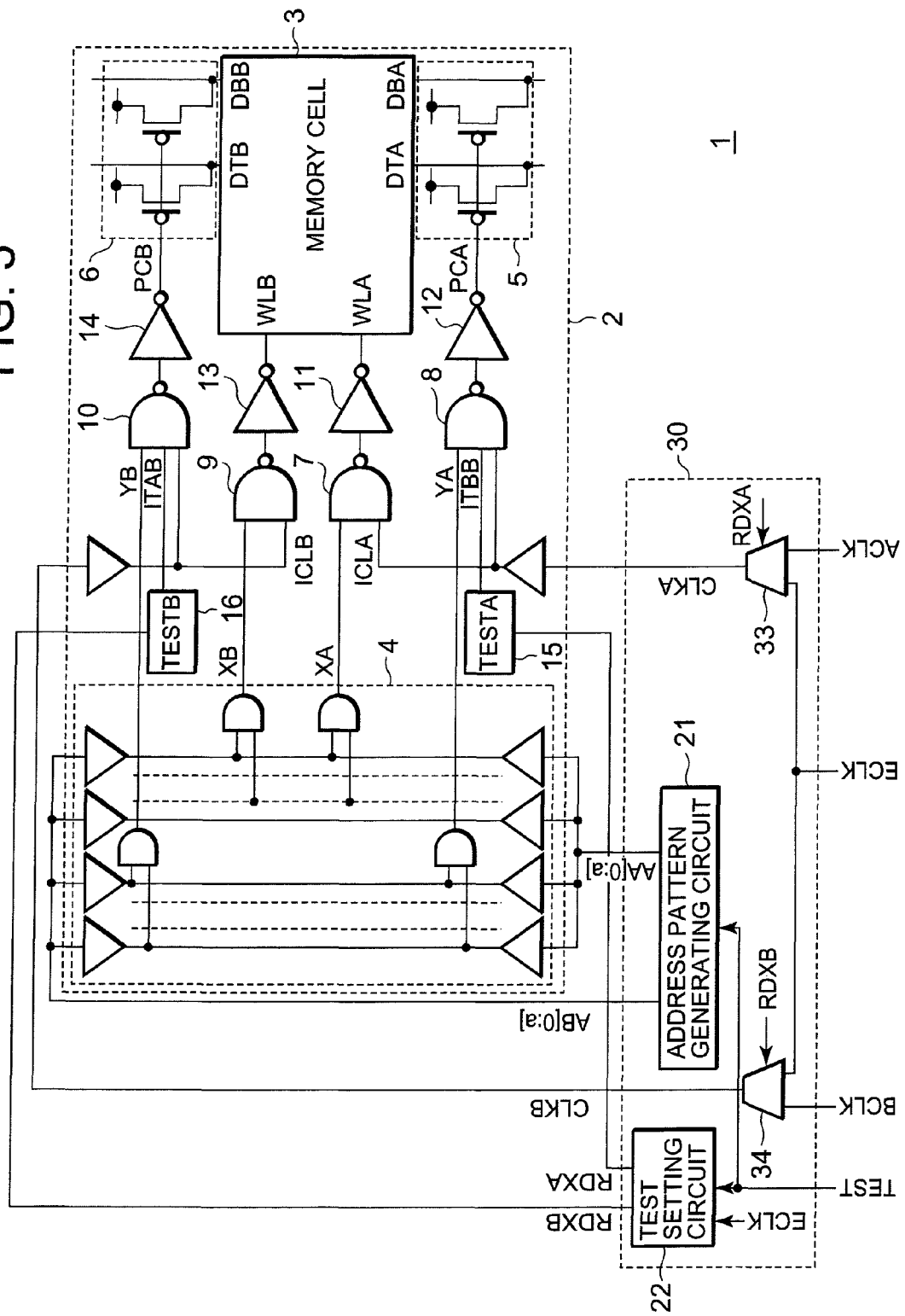
FIG. 5 is a block diagram of a semiconductor device according to a second embodiment of the invention.

As shown by FIG. 5, the second embodiment of the invention differs from the first embodiment mentioned above in that a BIST circuit 30 is supplied with a clock signal ECLK and that selectors 33 and 34 are provided and any of user clock signals ACLK/BCLK or the clock signal ECLK is supplied to the RAM macro 2a as clock signals CLKA/CLKB in accordance with the port setting signals RDXA/RDXB. Further, the second embodiment differs from the first embodiment in that the clock signals CLKA/CLKB are respectively supplied to internal clock signals ICLA/ICLB by way of buffers 19-1 and 19-2 and the internal clock signals ICLA/ICLB are generated by clock signals CLKA/CLKB supplied from the BIST circuit 30. Other constituent elements are the same as those of FIG. 1, and an explanation thereof will be omitted by designating the constituent elements by the same reference numerals.

The clock signal ECLK is a clock signal having a duty ratio different from those of the user clock signals ACLK/BCLK and a time period at "H" level is longer than those of the user clock signals ECLK/BCLK. The clock signal ECLK is supplied to the nonselected port determined by the port setting signal as the clock signal and the internal clock signal is generated based on the clock signal ECLK.

An explanation will be given of operation of the RAM macro 2a and the test circuit 30 according to the second embodiment in reference to FIG. 6.

Figure 6:
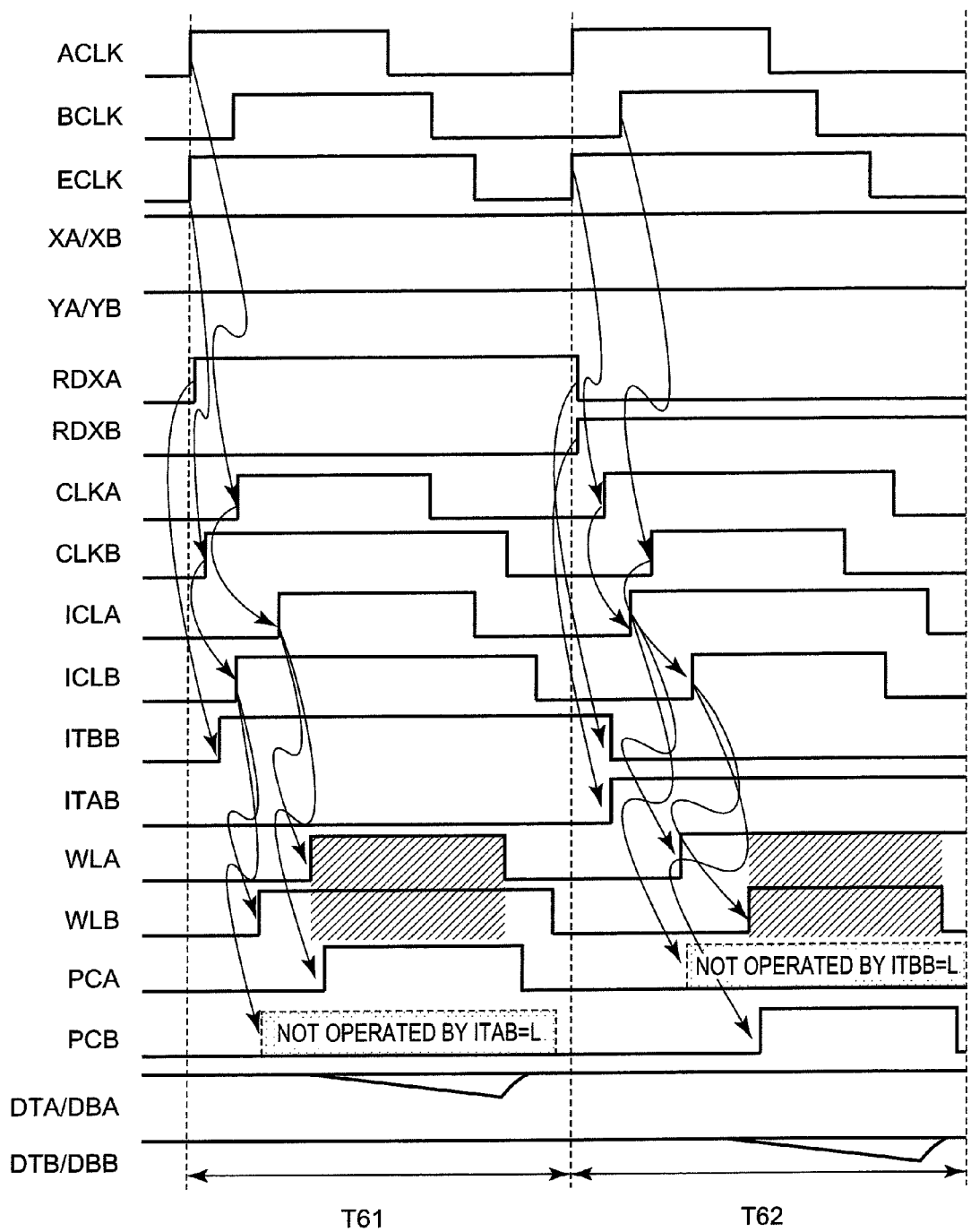
FIG. 6 is a waveform diagram illustrating an operation of the semiconductor device shown in FIG. 5.

FIG. 6 shows an operation constituting a selected port by A port in a time period T61 and an operation of constituting a selected port by B port in a time period T62 similar to FIG. 2. In the time period T61, the operation of A port is similar to the operation of the time period T51 explained in reference to FIG. 2, and therefore, an explanation thereof will be omitted.

The selector 34 outputs the clock signal ECLK as the internal clock signal CLKB in response to that the port setting signal RDXA indicating that A port is selected is at "H" level. The word line WLB of B port becomes "H" level based on the internal clock signal CLKB. On the other hand, a time period of the word line WLA of A port at "H" level is determined by the internal clock signal ICLA based on the user clock signal ACLK. A time period of the clock signal ECLK at "H" level is longer than that of the user clock signal ACLK, and therefore, the word line WLB is activated by including the time period of activating the word line WLA. Further, a state of precharging the bit line DTB/DBB of B port is maintained based on the precharge control signal ITAB constituting "L" level by receiving the port setting signal RDXB constituting "L" level. In this way, the state of the simultaneous access operation is reproduced.

According to the second embodiment of the invention, by directly inputting and selecting the test clock signal ECLK, a control circuit for the internal clock signal is not needed at inside of the RAM macro. As a result, an area of the RAM macro can be reduced. Further, the BIST circuit can control plural macros simultaneously, it is not necessary to provide plural the BIST circuits and an increase in the area can be restrained. Therefore, an area of a total of a chip can be reduced.

As described above, according to the invention, the worst state in reading can be reproduced regardless of a delay between clock terminals, and therefore, a pertinent standard can be set in testing a chip, and a test quality can be promoted.

It is apparent that the present invention is not limited to the above embodiments, but may be modified and changed without departing from the scope and spirit of the invention.

What is claimed is:

1. A semiconductor device comprising:
    a RAM macro including a memory block having a plurality of memory cells accessible from a plurality of ports, a first word line control circuit for activating a word line of a first port in the plurality of ports in accordance with a first word line control signal, a first precharge control circuit for precharging a bit line of the first port, a second word line control circuit for activating a word line of a second port in the plurality of ports in accordance with a second word line control signal, and a second precharge control circuit for precharging a bit line of the second port; and
    a test circuit including a test setting circuit generating first and second port setting signals in response to a test mode signal, each of the first and second port setting signals being indicative of a selected state of an associated one of the first and second port, and first and second selecting circuits each supplying one of a clock signal to an associated one of the first and second word line control circuits in response to an associated one of first and second port setting signals,
    wherein each of the first and second word line control circuits activates an associated one of the first and second word lines in response to the clock signal when an associated one of the first and second ports is the selected state based on the associated one of the first and second port setting signals, and activates the associated one of the first and second word lines irrespective of the clock signal when the associated one of the first and second port is not the selected state based on the associated one of the first and second port setting signals, each of the first and second precharge control circuit precharges the bit line of the associated one of first and second ports when the associated one of the first and second port is not the selected state.

2. The semiconductor device according to claim 1, wherein when the first port is the selected state and the second port is not the selected state, a time period during which the second word line control circuit activates the word line of the second port includes a time period during which the first word line control circuit activates the word line of the first port in response to the clock signal.

3. The semiconductor device according to claim 1, wherein when the first port is the selected state and the second port is not the selected state, the second precharge control circuit precharges the bit line of the second port during period from when a data appears at the bit line of the first port based on an access to the memory block through the first port to when the data is amplified by a sense amplifier.

4. The semiconductor device according to claim 1, wherein the first word control circuit activates the word line of the first port in response to the second port setting signals when the first port is not the selected state and the second port is the selected state.

5. The semiconductor device according to claim 1, wherein the first word control circuit activates the word line of the first port in response to a test clock signal which is different from the clock signal when the first port is not the selected state.

6. The semiconductor device according to claim 5, wherein a duty ratio of the test clock signal differs from a duty ratio of the clock signal.

7. The semiconductor device according to claim 1, wherein the test circuit includes an address signal generating circuit for supplying address signals respectively for the plurality of ports, and the address signal generating circuit generates the address signals for making an access to the same memory cell for the plurality of ports in accordance with the test mode signal.

* * * * *